United States Patent
Yamamoto et al.

(10) Patent No.: US 10,451,974 B2
(45) Date of Patent: Oct. 22, 2019

(54) RINSE COMPOSITION, A METHOD FOR FORMING RESIST PATTERNS AND A METHOD FOR MAKING SEMICONDUCTOR DEVICES

(71) Applicant: AZ Electronic Materials (Luxembourg) S.a.r.l., Luxembourg (LU)

(72) Inventors: Kazuma Yamamoto, Kakegawa (JP); Yuriko Matsuura, Kakegawa (JP); Tomoyasu Yashima, Kakegawa (JP); Tatsuro Nagahara, Kakegawa (JP)

(73) Assignee: AZ Electronic Materials (Luxembourg) S.a.r.l., Luxembourg (LU)

(*) Notice: Subject to any disclaimer, the term of this patent is extended or adjusted under 35 U.S.C. 154(b) by 0 days.

(21) Appl. No.: 16/308,168

(22) PCT Filed: Jun. 19, 2017

(86) PCT No.: PCT/EP2017/064908
§ 371 (c)(1),
(2) Date: Dec. 7, 2018

(87) PCT Pub. No.: WO2017/220479
PCT Pub. Date: Dec. 28, 2017

(65) Prior Publication Data
US 2019/0250515 A1    Aug. 15, 2019

(30) Foreign Application Priority Data
Jun. 20, 2016    (EP) .................................... 16001379

(51) Int. Cl.
*C11D 1/12* (2006.01)
*G03F 7/40* (2006.01)
(Continued)

(52) U.S. Cl.
CPC ................ *G03F 7/40* (2013.01); *C11D 1/004* (2013.01); *C11D 3/2055* (2013.01); *C11D 3/48* (2013.01);
(Continued)

(58) Field of Classification Search
CPC .................................................. C11D 11/0047
(Continued)

(56) References Cited

U.S. PATENT DOCUMENTS 7,741,260 B2    6/2010    Koshiyama et al.
9,298,095 B2 *  3/2016    Wang .................... G03F 7/0007
(Continued)

FOREIGN PATENT DOCUMENTS

EP    1580607 A2    9/2005
EP    1752827 A1    2/2007
(Continued)

OTHER PUBLICATIONS

International Search Report for PCT/EP2017/064908 dated Oct. 11, 2017.
(Continued)

*Primary Examiner* — Gregory E Webb
(74) *Attorney, Agent, or Firm* — Drinker Biddle & Reath LLP

(57) ABSTRACT

The present invention relates to a new rinse composition, the forming of resist patterns using the rinse composition, and a semiconductor device manufacturing method using the rinse composition in a photolithography method.

11 Claims, 1 Drawing Sheet

(51) Int. Cl.
*C11D 3/20* (2006.01)
*C11D 3/48* (2006.01)
*C11D 11/00* (2006.01)
*C11D 1/00* (2006.01)
*G03F 7/039* (2006.01)
*G03F 7/20* (2006.01)

(52) U.S. Cl.
CPC ........ C11D 11/0047 (2013.01); *G03F 7/0392* (2013.01); *G03F 7/2004* (2013.01)

(58) Field of Classification Search
USPC ........................................... 510/175
See application file for complete search history.

(56) References Cited

U.S. PATENT DOCUMENTS

2014/0057437 A1  2/2014  Kozawa et al.
2014/0234783 A1*  8/2014  Wang .................... G03F 7/0007
                                                    430/325
2016/0109805 A1*  4/2016  Matsuura .............. G03F 7/0382
                                                    430/325

FOREIGN PATENT DOCUMENTS

| EP | 1804124 A1 | 7/2007 |
| EP | 1832931 A1 | 9/2007 |
| EP | 2711776 A1 | 3/2014 |
| JP | 2005309260 A | 11/2005 |
| JP | 201444298 A | 3/2014 |

OTHER PUBLICATIONS

Namatsu, H., et al., "Dimensional limitations of silicon nanolines resulting from pattern distortion due to surface tension of rinse water", Applied Physics Letters, vol. 66, No. 20, (1995), pp. 2655-2657.
Written Opinion of the International Searching Authority for PCT/EP2017/064908 dated Oct. 11, 2017.

* cited by examiner

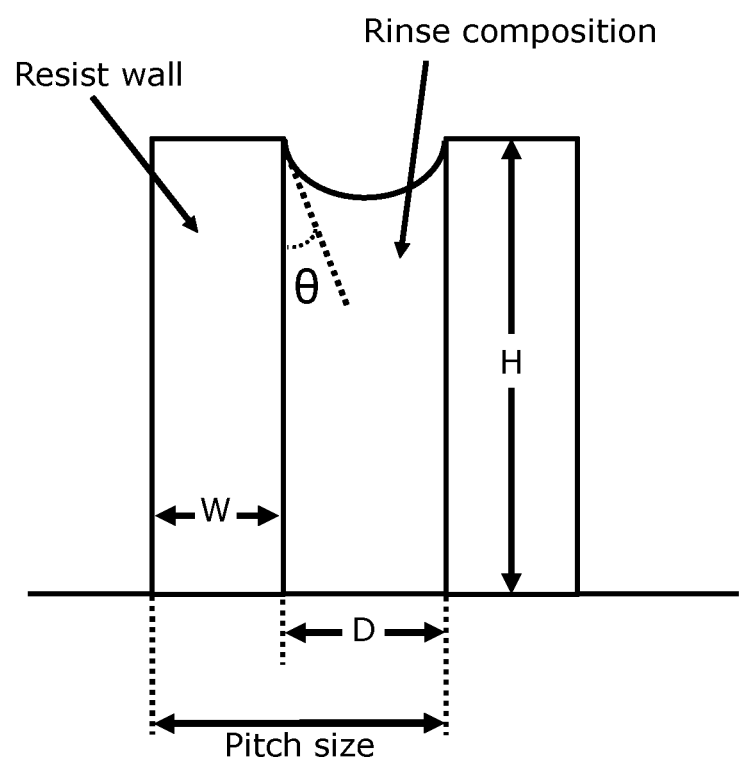

RINSE COMPOSITION, A METHOD FOR FORMING RESIST PATTERNS AND A METHOD FOR MAKING SEMICONDUCTOR DEVICES

CROSS-REFERENCE TO RELATED APPLICATIONS

This application is a national stage application (under 35 U.S.C. § 371) of PCT/EP2017/064908, filed Jun. 19, 2017, which claims benefit of European Application No. 16001379.3, filed Jun. 20, 2016, both of which are incorporated herein by reference in their entirety.

TECHNICAL FIELD

The present invention relates to a rinse composition and a method for forming a photoresist pattern using the rinse composition. One embodiment of the present invention relates to a rinse composition for lithography which is used preferably and suitably in a rinse process after development of a photosensitive resin composition applied for manufacturing of a semiconductor device, a flat panel display (FPD) such as a liquid crystal display element, a color filter and so on and to a method for forming a photoresist pattern using the rinse solution. Another embodiment of the present invention relates to a semiconductor manufacturing method that includes a resist pattern rinse process using the rinse composition.

BACKGROUND

In various fields such as manufacturing of semiconductor integrated circuits for example a Large Scale Integration (LSI), display faces of flat panel displays (FPDs), circuit substrates, color filters, and so on, photolithography technology has so far been employed for conducting fine processing. In the photolithography technology, a positive- or negative-working photosensitive resin composition (photoresist composition) is used for forming a resist pattern.

Along with smaller devices having more processing ability, more fine patterns in integrated circuits are required. Due to the high surface tension, pure water washing and soon after drying can cause resist pattern collapse. One approach to prevent pattern collapse is to research a rinse composition with a low surface tension. But, add to the surface tension, the resist pattern shape, especially pitch width has influences to the stress to the resist pattern. As described in "Dimensional limitations of silicon nanolines resulting from pattern distortion due to surface tension of rinse water" Namatsu et al. Appl. Phys. Lett. 1995 (66) p 2655-2657, a short distance between pattern walls will cause the stress more. And a narrow pattern wall width will cause the stress more too.

Patent publication JP2005-309260A discloses a rinse composition having a fluorine containing surfactant to prevent resist pattern collapse by rinsing. Patent pulication JP2014-44298A discloses a rinse composition having a linear alkane diol to prevent resist pattern collapse by rinsing.

SUMMARY OF THE INVENTION

Problems to be Solved by the Invention

For more fine patterns, it means those patterns would be exposed to severer stresses by rinse dry, and, accordingly, further developments for rinse composition suitable for fine patterns are required. Our inventors found a water-base rinse composition described in this specification that exhibits good performances for narrow pitched resist pattern rinsing, for example pitches in the patterns that are narrower than 20 nm. After resist pattern rinsing with above rinse composition and drying it, pattern collapse can be prevented and pattern deficiencies are reduced. The present invention also provides a method to form resist patterns comprising a rinsing step, and a method to manufacture semiconductor devices.

BRIEF DESCRIPTION OF THE DRAWINGS

FIG. 1 is a schematic illustration showing the condition of resist walls rinsing.

DEFINITIONS

Unless otherwise stated, the following terms used in the specification and claims shall have the following meanings for the purpose of this Application.

In this application, the use of the singular includes the plural, and the words "a", "an" and "the" mean "at least one", unless specifically stated otherwise. Furthermore, the use of the term "including", as well as other forms such as "includes" and "included", is not limiting. Also, terms such as "element" or "component" encompass both elements or components comprising one unit and elements or components that comprise more than one unit, unless specifically stated otherwise. As used herein, the conjunction "and" is intended to be inclusive and the conjunction "or" is not intended to be exclusive, unless otherwise indicated. For example, the phrase "or, alternatively" is intended to be exclusive. As used herein, the term "and/or" refers to any combination of the foregoing elements including using a single element.

The term "about" or "approximately," when used in connection with a measureable numerical variable, refers to the indicated value of the variable and to all values of the variable that are within the experimental error of the indicated value (e.g., within the 95% confidence limit for the mean) or within ±10 percent of the indicated value, whichever is greater.

As used herein, "$C_{x\text{-}y}$", "$C_x\text{-}C_y$," and ""$C_x$" designate the number of carbon atoms in a molecule. For example, $C_{1\text{-}6}$ alkyl chain refers to an alkyl chain having a chain of between 1 and 6 carbons (e.g., methyl, ethyl, propyl, butyl, pentyl and hexyl).

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Means for Solving the Problems

A rinse composition of present invention comprises: a surfactant represented by below formula (I), a $C_2$-$C_{16}$ diol derivative, and water,

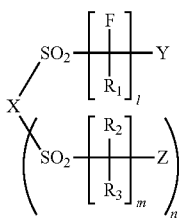

formula (I)

wherein X is an oxygen, nitrogen or carbon,
$R_1$, $R_2$ and $R_3$ are independently hydrogen, fluorine or $C_{1-5}$ alkyl,
Y is a hydrogen, fluorine, or $C_{1-5}$ alkyl
each Z is independently hydrogen, fluorine, or $C_{1-5}$ alkyl,
or Y and Z are taken together to form a single bond,
l is 1, 2, 3, 4 or 5,
m is 0, 1, 2, 3, 4 or 5, and
n is 0, 1 or 2.

And a rinse composition of present invention optionally further comprises at least one additional component selected from acids, bases, surfactants other than the surfactant represented by formula (I) and an organic solvent other than the diol derivative represented by formula (II).

And a rinse composition of present invention optionally further comprises at least one additional component selected from fungicides, antimicrobial agents, preservatives and antifungal agents.

A method for forming resist patterns of present invention, comprises:
(1) applying a photosensitive resin composition on a substrate or one or more other layers on the substrate to make a photosensitive resin composition layer,
(2) exposing the photosensitive resin composition layer,
(3) developing the exposed photosensitive resin composition layer, and
(4) rinsing the developed layer with the rinse composition of present invention.

A semiconductor device manufacturing method of present invention comprises the method forming resist patterns thereof.

A semiconductor device manufacturing method of present invention further comprises making gaps of the substrate with using the formed resist patterns as a mask.

Effects of the Invention

A present invention rinse composition exhibits good performances for narrow pitched resist pattern rinsing, and can prevent pattern collapse and pattern deficiencies. With using this invention rinse composition and method of rinsing thereof, the efficiency is improved to form resist patterns on the integrated circuit devices (as like semiconductors) and manufacturing them.

DETAILED DESCRIPTION OF THE INVENTION

It is to be understood that both the foregoing general description and the following detailed description are illustrative and explanatory, and are not restrictive of the subject matter, as claimed.

<Rinse Composition>

Our invention provide new rinse composition which comprises: a surfactant represented by below formula (I), a $C_2$-$C_{16}$ diol derivative, and water,

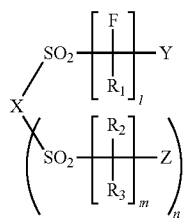

formula (I)

wherein X is an oxygen, nitrogen or carbon,
$R_1$, $R_2$ and $R_3$ are independently hydrogen, fluorine or $C_{1-5}$ alkyl,
Y is a hydrogen, fluorine, or $C_{1-5}$ alkyl,
each Z is independently hydrogen, fluorine, or $C_{1-5}$ alkyl,
or Y and Z are taken together to form a single bond,
l is 1, 2, 3, 4 or 5,
m is 0, 1, 2, 3, 4 or 5, and
n is 0, 1 or 2.

<Surfactant>

The surfactant comprised by our invention rinse composition is described below.

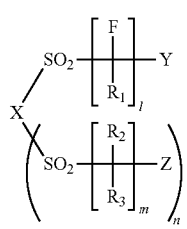

formula (I)

X is an oxygen, nitrogen or carbon. Preferably X is nitrogen or oxygen, more preferably X is nitrogen. Unless specific definition, remaining bonding bonds to hydrogen. For example, when formula (I) means Bis(1,1,2,2,3,3,3-heptafluoro-1-propanesulfonyl)imide, it can be read as X is a nitrogen, n=1, and the remaining 1 bonding of the nitrogen bonds to a hydrogen.

$R_1$, $R_2$ and $R_3$ are independently hydrogen, fluorine or alkyl whose carbon number is 1 to 5. Preferably, $R_1$, $R_2$ and $R_3$ are independently hydrogen, fluorine, methyl, ethyl, t-butyl or isopropyl. More preferably, all of $R_1$, $R_2$ and $R_3$ are fluorine.

Y is a hydrogen, fluorine, or $C_{1-5}$ alkyl. Preferably, Y is a hydrogen, fluorine, methyl, ethyl, t-buthyl, isopropyl or single bond bonding to Z.

More preferably, Y is a fluorine or single bond bonding to Z.

Z(s) is(are) independently hydrogen, fluorine, or $C_{1-5}$ alkyl. Preferably, Z(s) is(are) independently hydrogen, fluorine, methyl, ethyl, t-butyl, or isopropyl. More preferably, Z is a fluorine. In one embodiment, Y and Z are taken together to form a single bond.

For example, when formula (I) means 1,1,2,2,3,3-Hexafluoropropane-1,3-disulfonylmide, it can be read as n=1, l=2, m=1 and Y and Z are taken together to form a single bond.

l is 1, 2, 3, 4 or 5, preferably l is 1, 2, 3 or 4, more preferably l is 3 or 4.

m is 0, 1, 2, 3, 4 or 5, preferably m is 1, 2, 3 or 4, more preferably m is 3 or 4.

n is 0, 1 or 2, preferably n is 0 or 1, more preferably n is 1. It is understood that, when X is O, n is 0 or 1.

The present invention rinse composition can comprise 2 or more different surfactants from each other, who are each represented by formula (I). For example, surfactants combination of Bis(1,1,2,2,3,3,3-heptafluoro-1-propanesulfonyl)imide and Bis(1,1,2,2,3,3,4,4,4-nonafluoro-1-butanesulfonyl)imide is applicable for this invention. Exemplified examples of the surfactant comprised by our invention rinse composition is Bis(1,1,2,2,3,3,3-heptafluoro-1-propanesulfonyl)imide, Bis(1,1,2,2,3,3,4,4,4-nonafluoro-1-butanesulfonyl)imide, 1,1,2,2,3,3-Hexafluoropropane-1,3-disulfonylmide, Bis(trifluoromethanesulfonyl)imide, Nonafluoro-1-butanesulfonamide, Nonafluorobutanesulfonic acid, Bis (1,1,2,2,2-pentafluoroethanesulfonyl)imide, and a mixture thereof The surfactant in the present invention rinse composition can contribute to prevent pattern collapse after resist patterns are rinsed and dried. Without being bound by theory, one reason for the above effect is that the low affinity between the present invention surfactant and the resist wall can increase the contact angle of the rinse composition at rinse drying process.

Relative to the total mass of the rinse composition, content ratio of the above surfactant(s) of this rinse composition is preferably on or more than 0.01 and on or less than 0.5 mass %, more preferably on or more than 0.02 and on or less than 0.2 mass %, further preferably on or more than 0.03 and on or less than 0.1 mass %.

<Diol Derivative>

The $C_2$-$C_{16}$ diol derivative comprised by our invention rinse composition is described below.

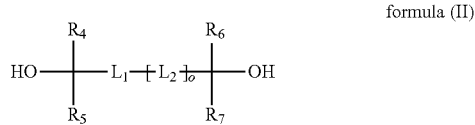

formula (II)

$R_4$, $R_5$ $R_6$ and $R_7$ are independently hydrogen, fluorine or $C_{1-5}$ alkyl.

Preferably, $R_4$, $R_5$ $R_6$ and $R_7$ are independently hydrogen, fluorine, methyl, ethyl, t-butyl or isopropyl. More preferably, $R_4$, $R_5$ $R_6$ and $R_7$ are independently hydrogen, methyl or ethyl. Further preferably $R_4$, $R_5$ $R_6$ and $R_7$ are independently methyl or ethyl.

$L_1$ and $L_2$ are independently $C_{1-5}$ alkane linker, $C_{2-4}$ alkene linker or $C_{2-4}$ alkyne linker. Preferable alkane linker is $C_2$ or $C_4$. Preferable alkene linker is $C_2$. Preferable alkyne linker is $C_2$.

$L_1$ and $L_2$ are independently unsubstituted, or substituted by fluorine, $C_{1-5}$alkyl(methyl, ethyl, t-butyl or isopropyl), or hydroxyl. Preferably $L_1$ and $L_2$ are unsubstituted or substituted by fluorine.

o is 0, 1 or 2, preferably o is 0 or 1, more preferably o is 0.

When formula (II) means 2,4-Hexadiyne-1,6-diol, it can be read as o=1, $L_1$ and $L_2$ are Acetylene linker (02 alkyne linker). When formula (II) means 2,2,3,3-Tetrafluoro-1,4-butanediol, it can be read as o=0, $L_1$ is a fluoroethylene linker (02 alkane linker, substituted by fluorines). The present invention rinse composition can comprise 2 or more diol derivatives different from each other, who are each represented by formula (II). For example, diol derivatives combination of 3-Hexyn-2,5-diol and 2,5-Dimethyl-3-hexyne-2,5-diol is applicable for this invention. Exemplified examples of the diol derivative comprised by our invention rinse composition are 3-Hexyn-2,5-diol, 2,5-Dimethyl-3-hexyne-2,5-diol, 3,6-Dimethyl-4-octyne-3,6-diol, 1,4-Butynediol, 2,4-Hexadiyne-1,6-diol, 1,4-Butanediol, 2,2,3,3-Tetrafluoro-1,4-butanediol, 2,2,3,3,4,4,5,5-Octafluoro-1,6-hexanediol, cis-1,4-Dihydroxy-2-butene, and a mixture thereof.

The diol derivative in the present invention rinse composition can contribute to reduce deficiencies of the resist patterns after rinsing and drying them. Comparing to small molecule which has 1 hydroxyl for example ethanol, the diol derivative can prevent immigrations into resist walls which could cause resist pattern melting.

Relative to the total mass of the rinse composition, content ratio of the above diol derivative(s) of this rinse composition is preferably on or more than 0.01 and on or less than 0.5 mass %, more preferably on or more than 0.02 and on or less than 0.2 mass %, further preferably on or more than 0.03 and on or less than 0.1 mass %.

<Water>

The water of the present invention rinse composition is a solvent for this composition, preferably pure water or deionized water. As a liquid component the water constitutes major solvent though this rinse composition can comprise other liquid components.

Relative to the total mass of the rinse composition, content ratio of the above water of this rinse composition is preferably on or more than 80.00 and on or less than 99.98 mass %, more preferably on or more than 90.00 and on or less than 99.98 mass %, further preferably on or more than 95.00 and on or less than 99.98 mass %.

<Other Components>

The present invention rinse composition may further comprise additives, for example an acid, a base, an organic solvent, other water-soluble compounds or mixtures thereof.

The acid or base can be used for adjusting a pH value of a process liquid or improving solubility of additive components. Carboxylic acids, amines, and ammonium compounds are examples of the acid and base. These include fatty acids, aromatic carboxylic acids, primary amines, secondary amines, tertiary amines, and ammonium compounds and these compounds can be non-substituted or substituted by substituent(s). More specifically, the acid or base can be formic acid, acetic acid, propionic acid, benzoic acid, phthalic acid, salicylic acid, lactic acid, malic acid, citric acid, oxalic acid, malonic acid, succinic acid, fumalic acid, maleic acid, aconitic acid, glutaric acid, adipic acid, monoethanol amine, diethanolamine, triethanolamine, triisopropanolamine, ethylenediamine, diethylenetriamine, pentaethylenehexamine, piperizine, piperazine, morpholine, tetramethylammonium hydroxide, and combinations thereof. The preferable amount of the acid added is on or more than 0.005% by mass to on or less than 0.1% by mass (50 ppm to 1,000 ppm) relative to the total amount of the rinse composition. The preferable amount of the base added is on or more than 0.01% by mass to on or less than 0.3% by mass (100 ppm to 3,000 ppm) relative to the total amount of the rinse composition.

In the rinse composition of the present invention, optional organic solvents except water can be used as a co-solvent. The organic solvents have a function adjusting a surface tension of the rinse composition and can improve wettability to a surface of the resist. For the purpose above, water soluble organic solvents are preferable, for examples alcohols such as methyl alcohol, ethyl alcohol, isopropyl alcohol, and t-butyl alcohol; glycols such as ethylene glycol and diethylene glycol; ketones such as acetone and methyl ethyl ketone; esters such as methyl acetate, ethyl acetate, and ethyl lactate; dimethylformamide, dimethylacetaminde, dimethylsulfoxyde, methyl cellosolve, cellosolve, butyl cellosolve, cellosolve acetate, alkyl cellosolve acetate, propylene glycol alkyl ether, propylene glycol alkyl ether acetate, butyl carbitol, carbitol acetate, and tetrahydrofuran.

Preferable content ratio of the organic solvent is on or less than 5% by mass relative to the total mass of the rinse composition, more preferably on or less than 1% by mass, further preferably on or more than 0.01 to on or less than 0.3% by mass (100 to 3,000 ppm). Too much organic solvents in the rinse composition can dissolve or denature resist patterns. 0% of the organic solvent is also one embodiment of the present invention rinse composition.

As to the other water-soluble compounds, they can also be used for improving the dissolution of additive components. For example, other surfactant (different from surfactants represented by above formula (I)) are the examples. These other surfactants can be nonionic surfactants, cationic surfactants, anionic surfactants, or amphoteric surfactants. Of these, nonionic surfactants are preferred. For examples, Surfynol® manufactured by Nissin Chemical Industry Co., Ltd. and ADEKA® Pluronic manufactured by ADEKA CORPORATION are candidates for this invention rinse composition. The amount of these other surfactants is preferably on or more than 0.01% by mass to on or less than 0.3% by mass (100 ppm to 3,000 ppm) relative to the total mass of the rinse composition.

The present invention rinse composition can optionally comprise an antimicrobial, an antibacterial, an antiseptic, and/or a fungicide. These chemicals are used for preventing bacteria and fungi from propagating in an elapsed rinse composition. Examples of these chemicals are alcohols such as phenoxyethanol and isothiazolone. Bestcide (NIPPON SODA CO., LTD.) is a particularly effective antimicrobial, antibacterial, and fungicide. The amount of these chemicals in the present rinse composition is preferably on or more than 0.0001% by mass to on or less than 1% by mass (1 ppm to 10,000 ppm), more preferably on or more than 0.001% by mass to on or less than 0.1% by mass (10 ppm to 1,000 ppm).

The rinse composition of the present invention can be filtered with a filter to remove impurities and/or insolubles after components of the rinse composition are dissolved.

<A Method for Forming Resist Patterns>

A method for forming resist patterns according to the present invention are explained below. A lithography step in the pattern forming method of the present invention can be any one of methods wherein resist patterns are formed using known positive-working or negative-working photosensitive resin composition which can be developed with an alkali aqueous solution. As used herein, when the resin composition is described as being applied to a substrate, the resin composition can be applied directly on the substrate or with one or more other layers being applied between the substrate and the resin composition layer. One method is exemplified as below.

First, a photosensitive resin composition is applied on a surface of a substrate such as a silicon wafer or a glass plate, which is preprocessed if necessary, with a known coating method to form a photosensitive resin composition layer. An anti-reflection film can be formed on the substrate and later coated by the photosensitive resin composition layer, or can be formed on the photosensitive resin composition layer. The cross-sectional shape of the resist patterns and the exposure margin of the photosensitive resist composition can be improved by forming the anti-reflection film as an upper or lower layer of the photosensitive resist composition layer.

Typical examples of the known positive-working or negative-working photosensitive resin composition which can be developed by an alkaline developer used in the pattern forming method of the present invention are a photosensitive resin composition comprising a quinone diazide photosensitizer and an alkali-soluble resin, a chemically amplified photosensitive resin composition. The chemically amplified photosensitive resin composition is preferred from the viewpoint of forming fine resist patterns with a high resolution.

Examples of the quinone diazide compound, which can be used in a positive-working photosensitive resin composition comprising a quinone diazide photosensitizer and an alkali-soluble resin, include 1,2-benzoquinonediazide-4-sulfonic acid, 1,2-naphthoquinonediazide-4-sulfonic acid, 1,2-naphthoquinonediazide-5-sulfonic acid, and esters or amides of these sulfonic acids. Examples of the alkali-soluble resin described above include a novolak resin, polyvinylphenol, polyvinylalcohol, and a copolymer of acrylic acid or methacrylic acid. As preferred examples of novolak resins are phenols such as phenol, o-cresol, m-cresol, p-cresol, xylenol, and aldehydes such as formaldehyde, paraformaldehyde.

Known chemically amplified photosensitive resin compositions can be used as the chemically amplified photosensitive resin composition. As the known chemically amplified photosensitive resin composition, there are exemplified a positive-working type chemically amplified photosensitive resin composition comprising a compound which generates an acid by irradiation of actinic light or radiation (photo-acid generator) and a resin, polarity of which is increased by the action of an acid generated from the photo-acid generator and as a result, solubility for developer of which changes in an exposed area and a non-exposed area; or a negative-working type chemically amplified photosensitive resin composition comprising an alkali soluble resin, a photo-acid generator, and a crosslinking agent, wherein crosslinking of the resin by the crosslinking agent is caused by an action of an acid generated from the photo-acid generator and as a result, solubility for developer changes in an exposed area and a non-exposed area. For example, a chemical amplify PHS acrylate hydrate hybrid EUV resist is preferable, EIDEC Standard Resist 1 (EUVL Infrastructure Development Center, Inc.) is further preferable.

Further, acid-degradable dissolution inhibiting compounds, dyes, plasticizers, surfactants, photosensitizers, organic basic compounds, and compounds accelerating solubility in developer can optionally be used in the chemically amplified photosensitive resin composition.

The photosensitive resin composition is applied on a substrate such as a silicon wafer or a glass plate, on which an anti-reflection film is provided if necessary, by using an appropriate coating apparatus such as a spinner and an appropriate coating method. The photosensitive resin composition applied is then prebaked, for example, on a hot plate and as a result, solvent in the photosensitive resin composition is removed to form a photoresist film. The temperature of prebaking can be 70 C (Celsius) degree to 150 C degree, preferably 90 C degree to 150 C degree for 10 seconds to 180 seconds, preferably 30 seconds to 90 seconds when on a hot plate or for 1 minute to 30 minutes when in a clean oven. Such condition can be modified depending on the apparatus and the resist composition contents (resin, a solvent) being employed. The prebaked photoresist film is exposed using known exposure techniques such as a high pressure mercury lamp, a metal halide lamp, an ultra high pressure mercury lamp, a KrF excimer laser, an ArF excimer laser, a EUV irradiation device, a soft X-rays irradiation device, an electron drawing equipment etc. through a predetermined mask as needed. After the post-exposure bake (PEB), it is developed with a developer.

As a developing method, there can be adopted any methods, for example, a paddle developing method etc. As a developer, an alkaline developer is preferred example, exemplified as a water or aqueous solution of sodium hydroxide, tetramethylammonium hydroxide (TMH) and the like. After the development, the resist pattern formed can be rinsed (cleaned) with a rinse composition of the present invention.

In the resist patterns forming method of the present invention, a contact time of the rinse composition with a resist pattern (a processing time) is preferably on or less than one second. Those skilled in the art would understand that the processing temperature can be selected based on the conditions being employed. Further, any suitable method of contacting the rinse composition with a resist pattern can be used. A method of immersing a resist substrate in a rinse composition and a method of dripping a rinse composition onto a spinning resist substrate are examples.

In the present resist patterns forming method, a cleaning treatment can be conducted before treatment with the present invention rinse composition and/or after treatment with the present rinse composition. The former cleaning treatment is conducted for cleaning a developer which is attached to resist patterns and the latter cleaning treatment is conducted for cleaning the rinse composition used. The method of rinse treatment with a present invention rinse composition can be any known method. For example, it can be conducted by immersing a resist substrate in a rinse composition or dripping a rinse composition onto a spinning resist substrate. These methods can be used individually or in combination. In one embodiment, the cleaning treatment can be performed with pure water.

In another embodiment, the cleaning treatment can be performed with another rinse composition, different from pure water and the present invention rinse composition, and can be used before or after the present rinse composition treatment. Conducting the final rinsing step with the present rinse composition is preferred.

For drying rinse composition, spin-drying, evaporation under reduced pressure, air drying, heating substrate, and combination thereof can be used. Spin-drying the present invention rinse composition is preferable.

The present invention resist patterns forming method has less problems of a patterns collapse margin, defects, and LWR, and in particular, patterns collapse and melting in fine resist patterns with a high aspect ratio can be improved effectively. Here, the aspect ratio is defined as a ratio of height of the resist pattern to width of the resist pattern. The present invention resist patterns forming method preferably includes a lithography step in which fine resist patterns are formed, that is, a lithography step containing an exposure in which an exposure wavelength of 250 nm or less by a KrF excimer laser, an ArF excimer laser, an EUV, X-rays, electron beams or the like is used as an exposure light. In forming of ultra fine patterns by exposing a chemically amplified photosensitive resin composition with an extreme ultra violet ray (EUV, preferably 10~20 nm wavelength, more preferably 12~14 nm wavelength), a lithography using a present invention rinse composition can be used preferably from the point of view of prevention of pattern melting, prevention of patterns collapse, improvement of collapse limit critical dimension, and the like.

The resist patterns formed by of the present invention method can be used for a resist for etching, plating, ion diffusion treatment, and dyeing processing, for example. The resist film is peeled off as needed after processing.

<A Method to Manufacture Semiconductor Devices>

The above disclosed method for forming the resist patterns can be used in the present invention semiconductor manufacturing method. The resist patterns cleaned and formed by the present invention can be used as an etching mask for patterning of the substrate or one or more other layers on the substrate. Further known processing and circuit formation can be done to make a semiconductor device.

<Stress on the Resist Wall During Drying Rinse Composition>

As described in Namatsu et al. Appl. Phys. Lett. 1995 (66) p 2655-2657, and depicted schematically in FIG. 1, stress to resist wall during rinse drying can be described by the below formula.

$$\sigma_{max} = 6\gamma \cos \theta / D \times (H/W)^2$$

$\sigma_{max}$: Maximum stress to resist, $\gamma$: Surface tension of rinse
$\theta$: contact angle, D: Distance between walls
H: Height of the wall, W: Width of the wall Those length can be measured by known method, for example SEM photo.

As can be seen from the above formula, a short D or a short W cause the stress more. In this specification, "pitch size" means one unit of sequence resist pattern units of a W and a D, as described in FIG. 1. It means that the finer the resist patterns (the narrower pitched size) that are required, the more stress the resist patterns have. For such a strict condition, more improvement for the rinse composition are required.

In an integrated circuit, patterns on the circuit take complicated walls and trenches structures. The finest pitch size resist pattern will have the strictest condition.

For efficient manufacturing by the present invention rinse composition, the finest pitch size of a resist pattern of resist patterns on one whole circuit unit can be 20 nm or less. The "one whole circuit unit" is made to one semiconductor device in later processes. The term of "the finest pitch size" means the shortest length between two parallel resist walls on one whole circuit unit.

The known rinse composition described in Patent publication JP2005-309260A and JP2014-44298A cannot achieve pattern collapse prevention sufficiently. The finest pitch size of a resist pattern on one whole circuit unit using the rinse composition of the present invention is preferably on or more than 10 nm to on or less than 20 nm, more preferably on or more than 12 nm to on or less than 19 nm, further preferably on or more than 14 nm to on or less than 18 nm.

Reference will now be made to more specific embodiments of the present disclosure and experimental results that provide support for such embodiments. However, Applicants note that the disclosure below is for illustrative purposes only and is not intended to limit the scope of the claimed subject matter in any way.

Example 1

For a pattern collapse prevention performance evaluation, below procedures were done.

A Silicon wafer (SUMCO, 12 inch) surface was treated by a 1,1,1,3,3,3-Hexamethyldisilazane (HMDS) 90 C (Celsius) degree for 60 seconds. Chemical amplify PHS acrylate hydrate hybrid EUV resist was spin-coated on the silicon wafer, and soft-baked 110 C degree for 60 seconds to form a resist film in 50 nm thickness. The resist film on the wafer was exposed to light with varying the exposure dose through 20 nm size (line:space=1:1) mask in the EUV exposure apparatus (High NA Small Field Exposure Tool, NA=0.51, quadrupole). The wafer was post exposure baked (PEB) 110 C degree for 60 seconds. And the resist film was paddle-developed with 2.38% Tetramethylammonium Hydroxide (TMAH) aqueous solution for 30 seconds. Rinse water was poured into a puddle of the developer on the wafer, pouring thereof was continued while rotating the wafer to replace the developer with the rinse water, and the rotation of the wafer was stopped in a puddled state by water. Subsequently a rinse composition was introduced into the puddle of water, which is 500 ppm F1 surfactant described below chemical structure and 500 ppm A1 diol derivative described below in water (deionized water) and the wafer was rotated at high speed to dry it.

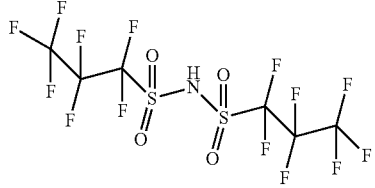

F1: Bis (1,1,2,2,3,3,3-heptafluoro-1-propanesulfonyl) imide

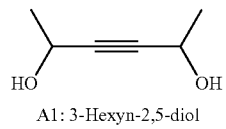

A1: 3-Hexyn-2,5-diol 0.5 μm×0.5 μm SEM photo of the resist patterns was taken. The pitch sizes of the resist patterns were approximately 20 nm.

Pattern collapse prevention performance was evaluated with CG4000 (Hitachi High-Technologies Corp.). The evaluation criteria are described as below.

A: Pattern collapse was not observed.
B: Pattern collapse(s) was observed.

For a deficiencies evaluation, below procedures were done. Chemical amplify PHS acrylate hydrate hybrid EUV resist was spin-coated on the silicon wafer (SUMCO, 12 inch), and soft-baked 110 C degree for 60 seconds to form a resist film in 50 nm thickness. The resist film was paddle-developed with 2.38% Tetramethylammonium Hydroxide (TMAH) aqueous solution for 30 seconds. Rinse water was to poured into a puddle of the developer on the wafer, pouring thereof was continued while rotating the wafer to replace the developer with the rinse water, and the rotation of the wafer was stopped in a puddled state by water. Subsequently the above rinse composition (500 ppm F1 surfactant and 500 ppm A1 in water) was introduced and the wafer was rotated at high speed to dry it.

Deficiencies of the resist patterns are evaluated with a wafer surface Inspection equipment $L_{59110}$ (Hitachi High-Technologies Corp.). The evaluation criteria are described as below.

A: Deficiencies number were 50% or less than the number of the resist patterns produced by same to above procedures except that the rinsing step with the rinse composition was not done.

B: Deficiencies number were more than 50% to the number of the resist patterns produced by same to above procedures except that the rinsing step with the rinse composition was not done.

Example 2 to 21. Comparative Example 1 to 6

Same procedures were done to the above example 1 for preparing resist patterns on the silicon wafer, provided that the rinse composition of the example 1 were changed as described below in table 1. Same evaluations were done. The results are described below in table 1.

TABLE 1

| | Surfactant (amount, ppm) | Diol derivative (amount, ppm) | Pattern collapse | Deficiencies |
|---|---|---|---|---|
| Example1 | F1 (500) | A1 (500) | A | A |
| Example2 | F2 (500) | A1 (500) | A | A |
| Example3 | F3 (500) | A1 (500) | A | A |
| Example4 | F4 (500) | A1 (500) | A | A |
| Example5 | F5 (500) | A1 (500) | A | A |
| Example6 | F6 (500) | A1 (500) | A | A |
| Example7 | F1 (500) | A2 (500) | A | A |
| Example8 | F2 (500) | A3 (500) | A | A |
| Example9 | F1 (500) | A1 (500) | A | A |
| Example10 | F1 (500) | A4 (500) | A | A |
| Example11 | F1 (500) | A5 (500) | A | A |
| Example12 | F1 (500) | A6 (500) | A | A |
| Example13 | F1 (500) | A7 (500) | A | A |
| Example14 | F1 (500) | A8 (500) | A | A |
| Example15 | F1 (500) | A9 (500) | A | A |
| Example16 | F1 (200) | A7 (500) | A | A |
| Example17 | F1 (1000) | A7 (500) | A | A |
| Example18 | F1 (2000) | A7 (500) | A | A |
| Example19 | F1 (500) | A1 (200) | A | A |
| Example20 | F1 (500) | A1 (1000) | A | A |
| Example21 | F1 (500) | A1 (2000) | A | A |
| Comp. ex.1 | F1 (500) | — | A | B |
| Comp. ex.2 | — | A1 (500) | B | A |
| Comp. ex.3 | F1 (500) | A10 (500) | B | B |
| Comp. ex.4 | F1 (500) | A11 (500) | B | B |
| Comp. ex.5 | F1 (500) | A12 (500) | B | B |
| Comp. ex.6 | F7 (500) | A1 (500) | B | A |

"Comp. ex." in above table means "Comparative example".

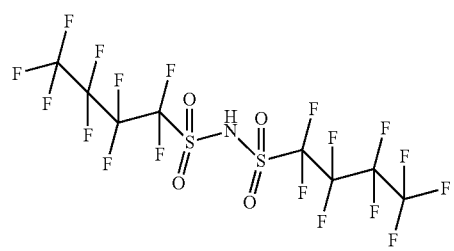

Bis(1,1,2,2,3,3,4,4,4-nonafluoro-1-butanesulfonyl)imide

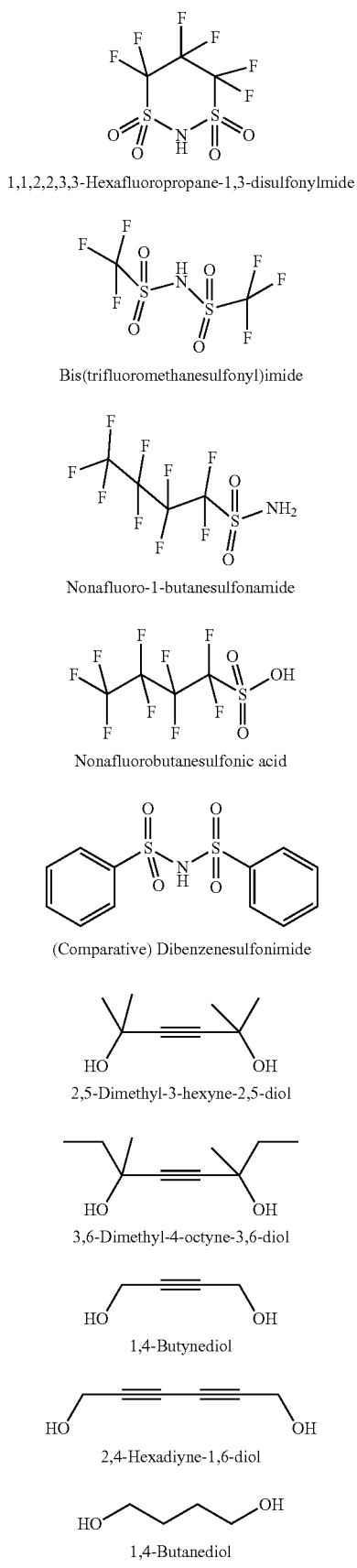
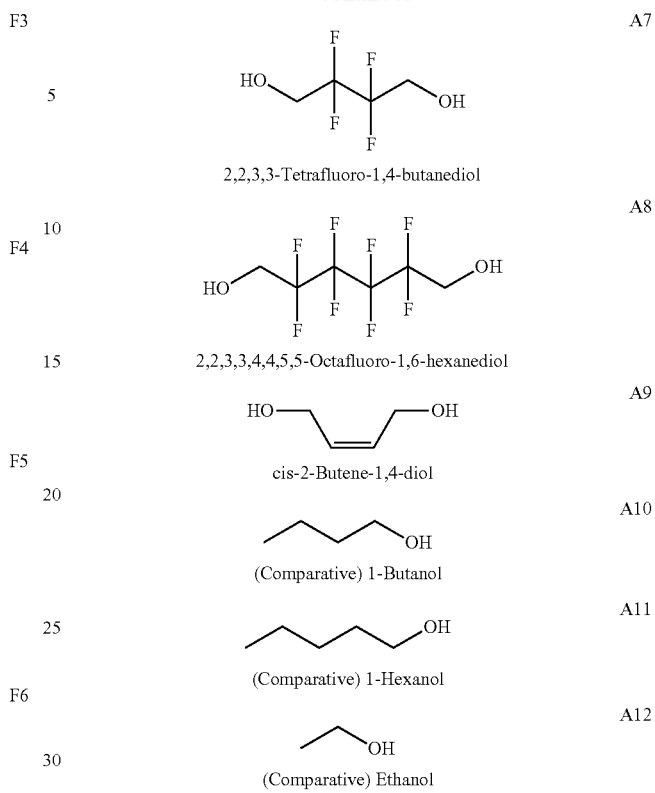

Example 22

Various pitch sized resist patterns were prepared as described below. Same procedures were done to the above pattern collapse prevention performance evaluation of the example 1 for preparing resist patterns on the silicon wafers, except that exposure mask sizes was varied from 24 nm to 15 nm (each line: space ratio are 1:1). Approximately 24, 23, 22, 21, 20, 19, 18, 17, 16 and 15 nm pitch sizes resist patterns were obtained on each silicon wafers. 0.5 μm×0.5 μm SEM photo of the resist patterns were taken.

Because the more stress during drying rinse composition applies to the resist pattern walls as narrower pitch size, the pattern collapse evaluation by CG4000 (Hitachi High-Technologies Corp.) was done from wider pitch size resist patterns to narrower one in order. When one pattern collapse was observed in one width pitched resist patterns, the narrower pitched size resist patterns were not evaluated because it had more severe condition.

In the example 22, pattern collapse was observed at the 18 nm pitched size resist patterns, and 17 to 15 pitched sizes resist patterns were not evaluated.

Example 23. Comparative Example 7 and 8

Same procedures were done to the above example 21 for preparing resist patterns on the silicon wafer, except that the rinse composition of the example 21 were changed as described below in table 2. Same evaluations to example 21 were done. The results are described on below table 2.

TABLE 2

| | Surfactant (amount, ppm) | Diol derivative (amount, ppm) | Width (nm) pattern collapse observed |
|---|---|---|---|
| Example 22 | F1 (500) | A1 (500) | 18 |
| Example 23 | F1 (1000) | A1 (500) | 16 |
| Comp. ex. 7 | F1 (500) | — | 19 |
| Comp. ex. 8 | — | A1 (500) | 21 |

"Comp. ex." in above table means "Comparative example".

In the finer resist patterns, the present invention rinse composition exhibited better performances for example pattern collapse preventing property.

The invention claimed is:

1. A rinse composition comprising a surfactant represented by below formula (I), a $C_2$-$C_{16}$ diol derivative, and water,

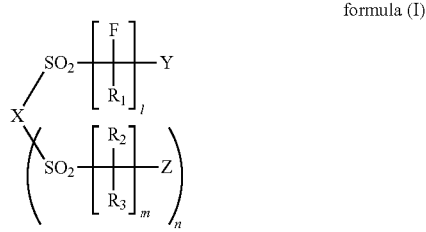

formula (I)

wherein X is an oxygen, nitrogen or carbon, $R_1$, $R_2$ and $R_3$ are independently hydrogen, fluorine or $C_{1-5}$ alkyl, Y is a hydrogen, fluorine, or $C_{1-5}$ alkyl, each Z is independently hydrogen, fluorine, or $C_{1-5}$ alkyl, or Y and Z are taken together to form a single bond, l is 1, 2, 3, 4 or 5, m is 0, 1, 2, 3, 4 or 5, and n is 0, 1 or 2 and wherein the diol derivative is represented by below formula (II),

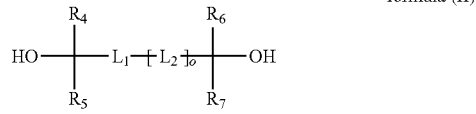

formula (II)

wherein $R_4$, $R_5$ $R_6$ and $R_7$ are independently hydrogen, fluorine or $C_{1-5}$ alkyl, $L_1$ and $L_2$ are independently $C_{1-5}$ alkane linker, $C_{2-4}$ alkene linker or $C_{2-4}$ alkyne linker, $L_1$ and $L_2$ are independently unsubstituted, or substituted by fluorine, $C_{1-5}$ alkyl, or hydroxyl, and o is 0, 1 or 2.

2. The rinse composition according to claim 1, wherein the content ratio of the surfactant represented by formula (I) is on or more than 0.01 and on or less than 0.5 mass % in the rinse composition.

3. The rinse composition according to claim 1, wherein the content ratio of the diol derivative is on or more than 0.01 and on or less than 0.5 mass % in the rinse composition.

4. The rinse composition according to claim 1, wherein the rinse composition further comprises at least one additional component selected from acids, bases, surfactants other than the surfactant represented by formula (I) and an organic solvent other than the diol derivative represented by formula (II).

5. The rinse composition according to claim 1, wherein the rinse composition further comprises at least one additional component selected from the group consisting of fungicides, antimicrobial agents, preservatives and antifungal agents.

6. The rinse composition according to claim 1, wherein the surfactant represented by formula (I) is Bis(1,1,2,2,3,3,3-heptafluoro-1-propanesulfonyl)imide, Bis(1,1,2,2,3,3,4,4,4-nonafluoro-1-butanesulfonyl)imide, 1,1,2,2,3,3-Hexafluoropropane-1,3-disulfonylmide, Bis(trifluoromethanesulfonyl)imide, Nonafluoro-1-butanesulfonamide, Nonafluorobutanesulfonic acid, Bis(1,1,2,2,2-pentafluoroethanesulfonyl)imide, or a mixture thereof, and the diol derivative represented by formula (II) is 3-Hexyn-2,5-diol, 2,5-Dimethyl-3-hexyne-2,5-diol, 3,6-Dimethyl-4-octyne-3,6-diol, 1,4-Butynediol, 2,4-Hexadiyne-1,6-diol, 1,4-Butanediol, 2,2,3,3-Tetrafluoro-1,4-butanediol, 2,2,3,3,4,4,5,5-Octafluoro-1,6-hexanediol, cis-1,4-Dihydroxy-2-butene, or a mixture thereof.

7. A method for forming resist patterns, comprising;
(1) applying a photosensitive resin composition on a substrate or one or more other layers on the substrate to make a photosensitive resin composition layer,
(2) exposing the photosensitive resin composition layer,
(3) developing the exposed photosensitive resin composition layer, and
(4) rinsing the developed layer with the rinse composition according to claim 1.

8. The method for forming resist patterns according to claim 7, wherein the photosensitive resin composition is a chemically amplified photosensitive resin composition and the exposure is an exposure with extreme ultra violet radiation.

9. The method for forming resist patterns according to claim 7, wherein the finest pitch size of the resist pattern on one whole circuit unit is on or more than 10 nm to on or less than 20 nm.

10. A semiconductor device manufacturing method comprising the method for forming resist patterns according to claim 7.

11. The semiconductor device manufacturing method according to claim 10, further comprising;
making gaps of the substrate with using the formed resist patterns as a mask.

* * * * *